US005535091A

United States Patent [19]

Lee

[11] Patent Number: 5,535,091

[45] Date of Patent: Jul. 9, 1996

[54] KEYBOARD STRUCTURE FOR MOBILE COMPUTERS

[76] Inventor: Michael Lee, 2F., No. 2, Lane 104, Ching-Hwa Street, Taipei, Taiwan

[21] Appl. No.: 341,121

[22] Filed: Nov. 18, 1994

[51] Int. Cl.$^6$ ....... H05K 5/00

[52] U.S. Cl. ....... 361/680; 248/220.21; 400/472

[58] Field of Search ....... 361/679, 680, 361/681; 248/220.42, 224.8, 220.21; 400/472, 480–489, 82; 200/303, 5 R; 235/145 R; 345/168; 364/708.1; 341/22

[56] References Cited

U.S. PATENT DOCUMENTS

| | | | |
|---|---|---|---|
| Re. 32,977 | 7/1989 | Gotoh et al. | 200/5 A |
| 4,876,415 | 10/1989 | Clancy | 200/5 A |
| 5,067,834 | 11/1991 | Szmanda et al. | 400/489 |
| 5,188,333 | 2/1993 | Schumacker et al. | 248/676 |
| 5,335,141 | 8/1994 | Hosoi | 361/680 |
| 5,428,502 | 6/1995 | Tsai | 361/680 |

*Primary Examiner*—Leo P. Picard
*Assistant Examiner*—Lynn D. Hendrickson

[57] ABSTRACT

A mobile computer keyboard including a metal frame, a plastic key base frame with key switches fastened to the metal frame to hold down a membrane circuit and a rubber frame. The metal frame has a plurality of retainer rods respectively terminating in a respective upwardly bent portion for guiding respective locating rods of the key base frame into engagement with the retainer rods, and a plurality of openings on two opposite upright sides thereof for allowing respective retaining blocks of the key base frame to be loaded onto the metal frame vertically from the top and then moved sideways into engagement with respective retaining grooves on the vertical sides of the metal frame.

2 Claims, 4 Drawing Sheets

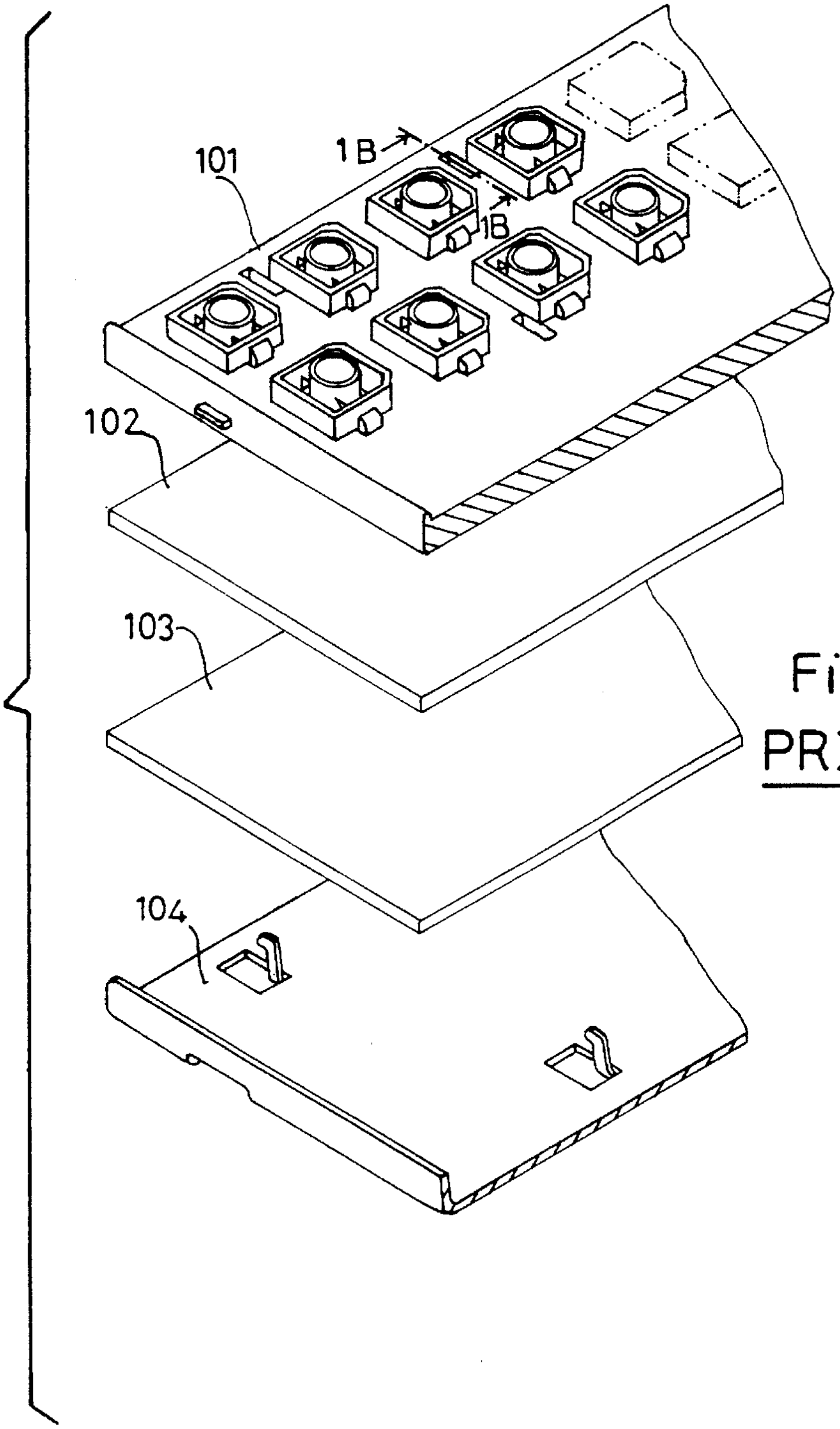
Fig. 1B PRIOR ART
Fig. 1A PRIOR ART

KEYBOARD STRUCTURE FOR MOBILE COMPUTERS

BACKGROUND AND SUMMARY OF THE INVENTION

The present invention relates to a mobile computers, and more particularly, to the keyboard structure of a mobile computer.

The keyboard structure of a conventional mobile computer, as shown in FIGS. 1A and 1B, is generally comprised of a metal frame 104 disposed at the bottom, a plastic key base frame with key switches 101 fastened to the metal frame at the top to hold down a membrane circuit (shown as box 103) and a rubber frame (shown as box 102) above the membrane circuit. The metal frame comprises a plurality of retainer rods respectively hooked up with respective locating rods in the locating holes on the plastic key base frame, and a plurality of retaining holes at two opposite sides respectively engaged with respective retaining blocks on two opposite sides of the plastic key base frame. This structure of a keyboard has drawbacks. When locating rods are forced into engagement with the retainer rods, they may be deformed or damaged by the retainer rods, resulting in a loose connection between the plastic key base frame and the metal frame. Furthermore, because the retaining blocks of the plastic key base frame must be respectively inserted into the retaining holes and then moved into position, the assembly process is complicated. The retaining blocks may be damaged easily during the installation process.

The present invention has been accomplished to provide a keyboard structure which eliminates the aforesaid drawbacks. According to one aspect of the present invention, the metal frame has a plurality of retainer rods respectively terminating in a respective upwardly bent portion for guiding respective locating rods of the key base frame into engagement with the retainer rods, and a plurality of openings on two opposite upright sides thereof for allowing respective retaining blocks of the key base frame to be loaded onto the metal frame vertically from the top and then moved sideways into engagement with respective retaining grooves on the vertical sides of the metal frame. Therefore, when the locating rods of the key base frame are respectively fastened to the retainer rods of the metal frame, the retainer rods of the metal frame do not damage the locating rods.

According to another aspect of the present invention, the metal frame comprises a plurality of upward projecting portions spaced above the retaining grooves and extending upwards toward the openings on the upright sides for guiding the retaining blocks of the key base frame into engagement with the retaining grooves on the upright sides of the metal frame.

BRIEF DESCRIPTION OF THE DRAWINGS

FIG. 1A is a broken view of a plastic key base frame and a metal frame, rubber frame, and membrane circuit, for a mobile computer keyboard according to the prior art.

FIG. 1B is a sectional view taken along line 1B—1B of FIG. 1A.

DETAILED DESCRIPTION OF THE PREFERRED EMBODIMENT

Figure 2:
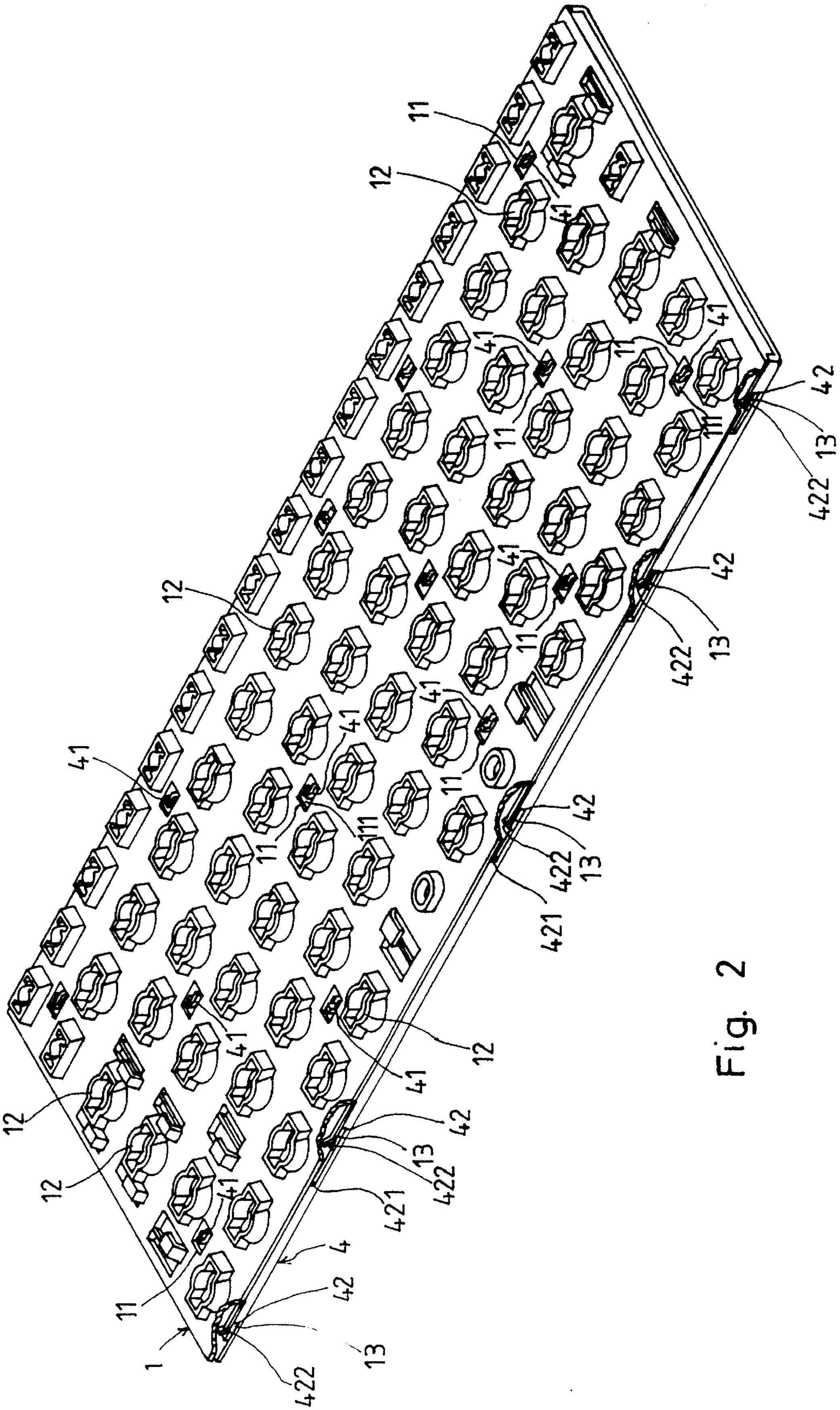
FIG. 2 is a perspective view of a mobile computer keyboard according to the present invention.
Figure 3:
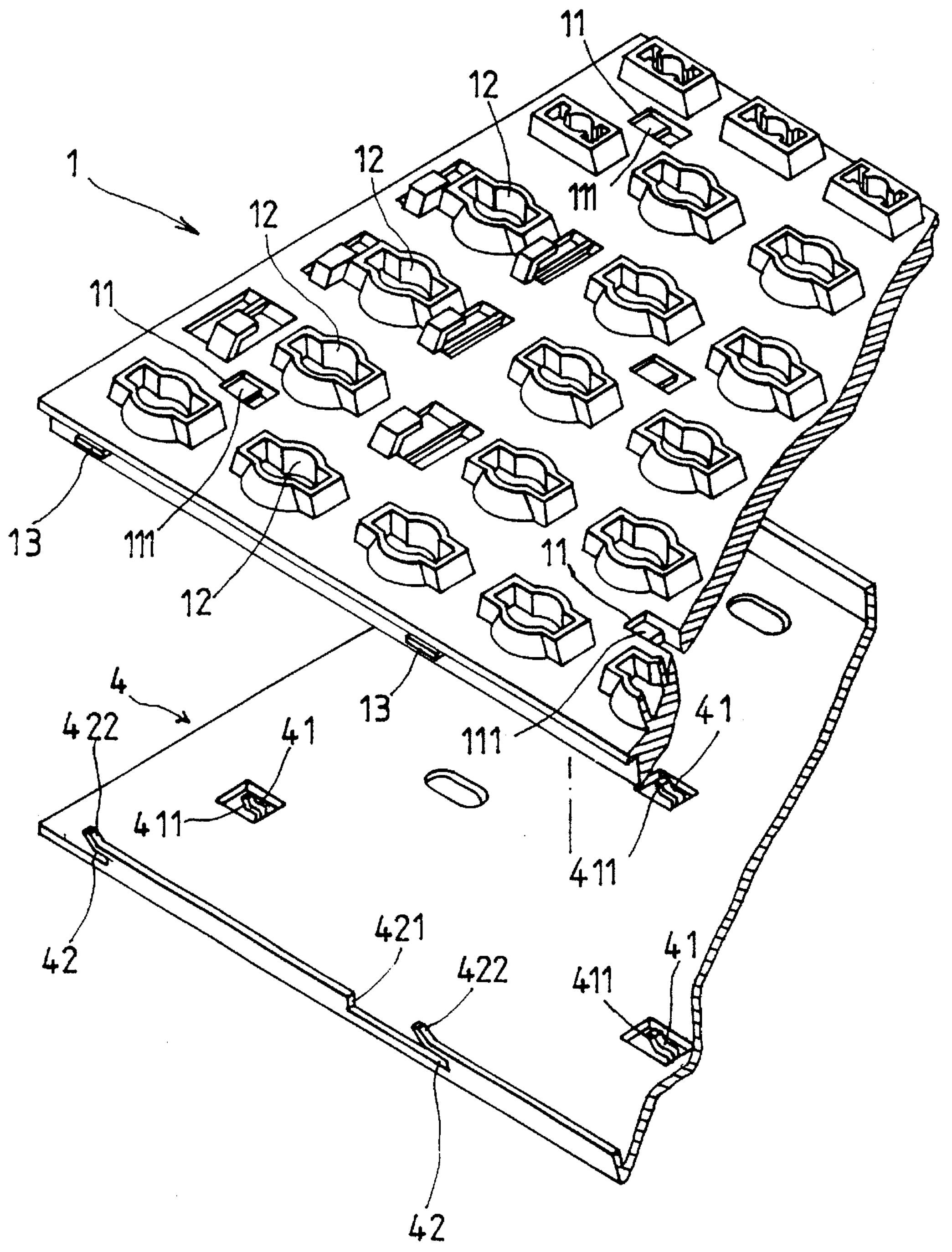
FIG. 3 is an exploded view of the plastic key base frame and metal frame of the mobile computer keyboard shown in FIG. 2.
Figure 4:
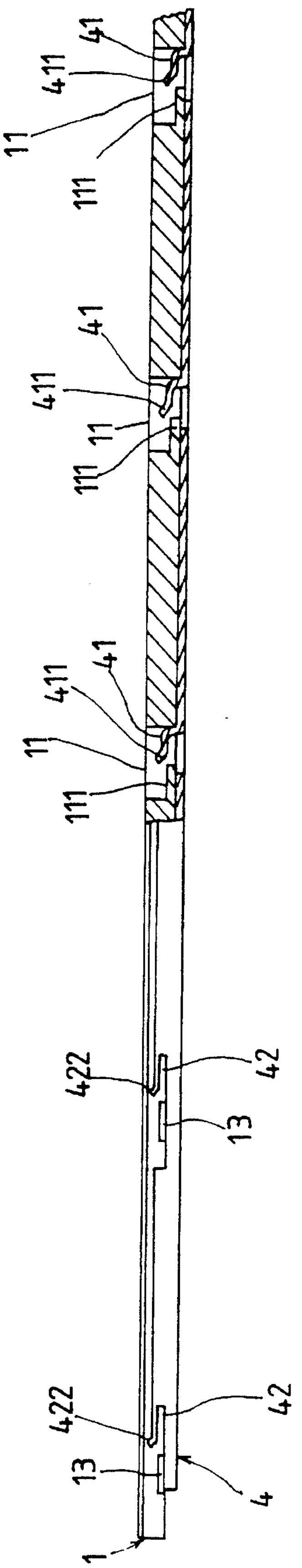
FIG. 4 is a side view in section showing the plastic key base of the mobile computer keyboard of FIG. 3 loaded on the metal frame.
Figure 5:
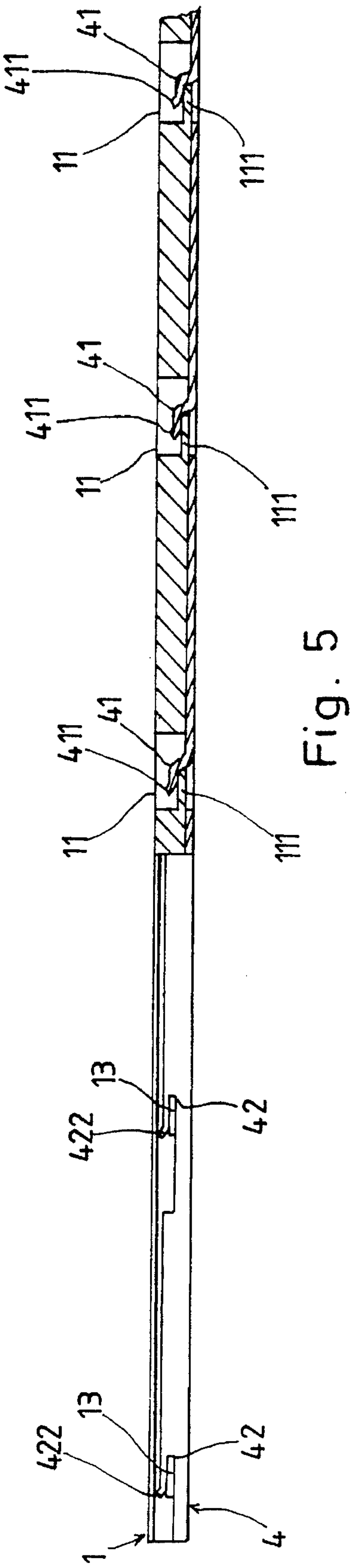
FIG. 5 is similar to FIG. 4 but showing the retainer rods and retaining blocks of the metal frame respectively engaged with the retaining grooves and locating rods of the plastic key base frame.

Referring to FIGS. 2 through 5, a keyboard for a mobile computer in accordance with the present invention is generally comprised of a plastic key base frame 1, a rubber frame (not shown, but arranged as shown for membrane circuit 103 in FIG. 1A), a membrane circuit (now shown, but arranged as shown for membrane circuit 103 in FIG. 1A), and a metal frame 4. The rubber frame is supported on the membrane circuit above the metal frame 4 to hold the plastic key base frame 1. The metal frame 4 comprises a plurality of retainer rods 41, and a plurality of retaining grooves 42 spaced on two opposite upright sides thereof. The plastic key base frame 1 comprises a plurality of locating holes 11, a plurality of locating rods 111 respectively projecting into the locating holes 11 and respectively engaged with the retainer rods 41 of the metal frame 4, a plurality of key holes 12 for holding a respective key switch (not shown), and a plurality of retaining blocks 13 spaced at two opposite sides and respectively fastened to the retaining grooves 42 on the metal frame 4.

The retainer rods 41 of the metal frame 4 have each a front end terminating in an upwardly bent portion 411 for guiding the locating rods 111 into position without causing any damage to the locating rods 111. The metal frame 4 further comprises a plurality of openings 421 disposed on the two opposite upright sides respectively extended from the retaining grooves 42. The length of the openings 421 is slightly longer than that of the retaining blocks 13. Therefore, the locating blocks 13 can be conveniently fastened to the retaining grooves 42 by loading the retaining blocks 13 on the openings 421 vertically from the top and then moving the plastic key base frame 1 sideways to force the retaining blocks 13 into the retaining grooves 42. The metal frame 4 further comprises a plurality of upward projecting portions 422 spaced above the retaining grooves 42 and extending upwards toward the openings 421 for guiding the retaining blocks 13 into the retaining groove 42 without causing any damage to the plastic key base frame 1 during the assembly process of the keyboard.

I claim:

1. A keyboard for a mobile computer comprising: a metal frame having two upright sides and a plurality of retainer rods defined between said two upright sides and a plurality of retaining grooves spaced on said upright sides; a membrane circuit supported on said metal frame, a rubber frame covered on said membrane circuit, and a key base frame covered on said rubber frame to hold a series of key switches, said key base frame comprising a plurality of locating holes, a plurality of locating rods respectively projecting into the locating holes and engaged with said retainer rods of said metal frame, and a plurality of retaining blocks at two opposite sides respectively fastened to said retaining grooves of said metal frame, wherein:

the retainer rods of said metal frame each have a respective front end terminating in an upwardly bent portion for guiding the locating rods of said key base frame into a position of engagement with the retainer rods of said metal frame; the upright sides of said metal frame comprises a plurality of openings of length slightly longer than that of said retaining blocks respectively extended from said retaining grooves for allowing said retaining blocks of said key base frame to be loaded on said metal frame vertically from the top into the openings on the upright sides of said metal frame and then moved sideways into engagement with said retaining grooves.

2. The keyboard of claim 1 wherein the upright sides of said metal frame comprises a plurality of upward projecting portions spaced above said retaining grooves and extending upwards toward said the openings on the upright sides of said metal frame for guiding said retaining blocks of said key base frame into engagement with the retaining grooves on the upright sides of said metal frame.

* * * * *